United States Patent
Fu et al.

(10) Patent No.: US 7,576,539 B2
(45) Date of Patent: Aug. 18, 2009

(54) METHOD AND APPARATUS FOR RECONSTRUCTING PARALLEL-ACQUIRED IMAGE

(75) Inventors: Cai Xia Fu, Shenzhen (CN); Jian Min Wang, Shenzhen (CN); Bi Da Zhang, Shenzhen (CN); Qiang Zhang, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/152,573

(22) Filed: May 15, 2008

(65) Prior Publication Data

US 2008/0285834 A1    Nov. 20, 2008

(30) Foreign Application Priority Data

May 17, 2007    (CN)    ................ 2007 1 0107510

(51) Int. Cl.
*G01V 3/00* (2006.01)
(52) U.S. Cl. ..................... 324/309; 324/307
(58) Field of Classification Search ......... 324/300–322; 600/410–435
See application file for complete search history.

(56) References Cited

U.S. PATENT DOCUMENTS

| | | | | |
|---|---|---|---|---|
| 4,678,996 A | * | 7/1987 | Haacke et al. | ............... 324/309 |
| 6,385,478 B1 | * | 5/2002 | Hajnal | ........................ 600/410 |
| 6,983,182 B2 | * | 1/2006 | Mistretta | .................... 600/425 |
| 7,309,984 B2 | * | 12/2007 | Arunachalam et al. | ...... 324/307 |
| 7,397,242 B2 | * | 7/2008 | Samsonov et al. | .......... 324/309 |
| 2003/0013953 A1 | * | 1/2003 | Mistretta | .................... 600/425 |
| 2007/0096733 A1 | * | 5/2007 | Arunachalam et al. | ...... 324/309 |
| 2008/0285833 A1 | * | 11/2008 | Fu et al. | .................... 382/131 |

* cited by examiner

*Primary Examiner*—Brij B Shrivastav
*Assistant Examiner*—Dixa Varges

(57) ABSTRACT

The invention discloses a method and an apparatus for reconstructing a parallel-acquired image, comprising: generating reconstruction data by combining uniformly under-sampled data and low-frequency fully-sampled data in MRI K-space according to a hybrid sampling mode; calculating the sensitivity distribution of a coil according to said low-frequency fully-sampled data; and reconstructing an image according to the reconstruction data, the coil's sensitivity distribution and the hybrid sampling mode. The signal to noise ratio of the reconstructed image is effectively improved by using the reconstruction data combined with the low-frequency fully-sampled data in reconstructing the image since the low-frequency fully-sampled data contains more useful information.

14 Claims, 5 Drawing Sheets

METHOD AND APPARATUS FOR RECONSTRUCTING PARALLEL-ACQUIRED IMAGE

CROSS REFERENCE TO RELATED APPLICATIONS

This application claims priority of Chinese application No. 200710107510.9 filed May 17, 2007, which is incorporated by reference herein in its entirety.

FIELD OF THE INVENTION

The present invention relates to magnetic resonance imaging (MRI, magnetic Resonance Imaging) technologies, and particularly to a method and an apparatus for reconstructing images by parallel acquisition (PA, Parallel Acquisition).

BACKGROUND OF THE INVENTION

In MRI technologies, the imaging speed is a very important parameter. Several hours were generally required for an examination in early stages of the technology, and since then the imaging speed has been increased quite significantly owning to the technical improvements in relation to field intensity, gradient hardware and pulse sequences. However, fast changes of field gradient and high density continuous radio frequency (RF) pulses would result in a specific absorption rate (SAR) and the amount of heat generated in organs and tissues which have become unbearably beyond human physiological limits, therefore increasing the imaging speed has met a bottleneck.

Thereafter, researchers found that the speed of magnetic resonance imaging could be greatly increased by virtue of the application of complicated computer aided image reconstruction algorithms together with cooperated coil array, and such a technology was commonly referred to as parallel imaging technology. The reconstruction of parallel-acquired images is a technology for image reconstruction using parallel acquisition, which utilizes the differences in the spatial sensitivities between phase-controlled arrayed coils to perform spatial encoding and utilizes the phase-controlled arrayed coils to acquire data simultaneously, so that when compared with the imaging speed of conventional MRI it obtained an imaging speed of 2 to 6 times higher or even more. By adopting the parallel imaging technology, it has brought forward new requirements to MRI systems; for example, there are needs for multiple receiving channels, multi-arrayed coils and calibration of the sensitivities of the coils, the use of special data processing and image reconstructing methods and so on.

Parallel imaging can increase image acquisition speed and the increase of imaging speed is achieved by reducing the filling rate in the K-space. However, if the filling rate in the K-space is below the limit of the sampling theorem, it would lead to the appearance of artifacts in the images reconstructed by using direct Fourier reconstruction. The images of common MRI are obtained by acquiring an object's information in frequency domain which is subject to Fourier transform. According to the sampling theorem, an object's repeat cycle in the image domain is in inverse proportion to the sampling interval in the frequency domain. If an image's spatial repeat cycle is smaller than the size of the image itself, the reconstructed images will be superposed, and this phenomenon is referred to as overlapping in signal processing. If the sampling intervals in phase encoding direction are equal to the reciprocal of the FOV in the phase encoding direction, it will be just right for the images not to overlap, and in this case the sampling in the K-space is referred to as full-sampling. When the sampling is done with sampling intervals greater than 1/FOV, it is referred to as under-sampling, that is to say, the K-space information acquired is not sufficient for reconstructing a complete image, and such under-sampling will cause image overlapping; when it is done in the opposite way, then it is called over-sampling which will not cause image overlapping. FIG. 1 shows illustrative images of full-sampling and under-sampling, in which the left-hand one is the full-sampling and the right-hand one is the under-sampling. In FIG. 1 the vertical direction is the phase encoding direction, the left image is full-sampling, and the sampling intervals in the phase encoding direction are $\Delta ky$; while the right image is ½ under-sampling, the sampling intervals in the phase encoding direction are $2\Delta ky$.

During MRI imaging, the magnetic resonance signals of tissues are acquired by a receiving coil. FIG. 2 shows the images obtained by the full-sampling and under-sampling in the phase encoding direction shown in FIG. 1. In FIG. 2, the vertical direction is the direction of phase, and the horizontal direction is the direction of frequency. As shown in FIG. 2, the left image is obtained by full-sampling with the sampling intervals of $\Delta ky$; while the right image is obtained by ½ under-sampling with the sampling intervals of $2\Delta ky$. As shown in the right image, if two adjacent surface coils (coil 1 and coil 2) are used to sample and acquire respectively the data from the object in the drawing, and the sampling rate in the phase encoding direction is 2/FOV, then after direct reconstruction two images with superposed artifacts will be obtained, and the field of view of each image will be FOV/2, but each image will contain the contents of the other image, that is to say, the value of each pixel in the right image is constituted by the contributions of two object units of the origin image, for example, the signal intensity of the pixel 1 in the right image is constituted by the contributions of two object units 1 and 2 in the left image, likewise, the signal intensity of the pixel 2 in the right image is also constituted by the contribution of two object units 2 and 1 in the left image. It is not difficult to see in the right image that the signal intensity of the artifact is weaker than the signal intensity of the origin image, this is because that is the sample's spinning signal is weighted by the sensitivity function of the coils, while the amplitude of the sensitivity function of a surface coil is relatively small in the area far from the coil. The overlapping caused by sampling depends on the way that the K-space is filled, i.e. the tracks in the K-space. The above-mentioned artifacts are ones caused by uniform grid under-sampling, as to helical tracks, the artifacts caused by under-sampling will be very irregular.

As to multi-coil acquisition, although the K-space information acquired by each coil is not sufficient, the differences between the signals acquired by different coils can be utilized and processed to obtain a complete image. The reconstruction algorithms for eliminating overlapped artifacts for parallel imaging can be divided roughly into two categories: the simultaneous acquisition of spatial harmonics technique (SMASH) and the sensitivity encoding parallel acquisition technique (SENSE). Among them, SMASH method is a method using the sensitivity functions of various channel coils to form spatial harmonics and to perform assistant encoding. The sensitivity function of an ordinary coil is of slow variation and can be regarded as a Gaussian distribution function, and then a linear combination of the sensitivity functions of various channel coils can be used to form spatial harmonics of a certain frequency. And the spatial harmonic function is used to make up a phase encoding line whose data are not actually acquired.

Differing from the solution of SMASH for processing in the frequency domain, the SENSE method eliminates the artifacts caused by under-sampling by solving the linear equation set in the image domain. Because the superposition effects resulted from the image's spatial cycles, for example, when the sampling rate is ½ of the full-sampling, the value of each pixel of the image obtained directly by Fourier transform is constituted by the contributions of two object units in the origin image. This can be expressed by formula (1):

$$s_1 = p_{11} m_1 + p_{12} m_2 \quad (1)$$

Formula (1) can be explained with reference to FIG. 2: the value of point 1 in the right image is determined by the sum of the product of the magnetization intensity m1 of the object unit 1 in the left image and the sensitivity P11 of the coil 1 at point 1 and the product of the magnetization intensity m2 of the object unit 2 and the sensitivity P12 of the coil 1 at point 2. The P11 and P12 are measurable quantities and two equations are needed to work out m1 and m2, that is to say the data measured by at least two individual coils are needed. If expressed with a matrix, it is:

$$\begin{bmatrix} s_1 \\ s_2 \end{bmatrix} = \begin{bmatrix} p_{11}, p_{21} \\ p_{12}, p_{22} \end{bmatrix} \cdot \begin{bmatrix} m_1 \\ m_2 \end{bmatrix} \quad (2)$$

wherein s2 is the value of the point 2 in the right image, p21 and p22 are defined the same as above. The formula (2) can be further expressed as:

$$S = PM \quad (3)$$

wherein S is the vector of Nc×1, and Nc is the number of channels. M is the vector of Np×1, and Np is the under-sampling rate. The origin image is obtained by working out the inverse of P. In the case that the number of channels is greater than the under-sampling rate, in the equation (3) Nc>Np, and this is a redundant linear equation set, that is, the number of known conditions is larger than that of unknown quantities. Generally the optimum solution is achieved by working out the plus inverse of P.

$$\hat{M} = (P^H P)^{-1} P^H S = WS \quad (4)$$

wherein the matrix W is referred to as a weighted matrix, and the upper superscript H represents the conjugate transpose.

In a RF electromagnetic field, a human body is regarded as a load, there will be variations in a coil's sensitivity function when measuring different human bodies, and these variations are sufficient to affect the quality of reconstructed image, therefore a coil's sensitivity is generally needed to be acquired in real-time. When collecting data the SENSE method performs full-sampling in the central region of K-space and performs under-sampling in peripheral regions. Thus the origin data of the k-space are divided into two parts: uniform under-sampled data and low frequency fully-sampled data. The uniform under-sampled data are used to generate an overlapped image, while the low frequency fully-sampled data are used to generate a blurred image of tissues and further to obtain the coil's real-time sensitivity distribution and a weighted matrix, and finally, the overlapped image produced with the uniform under-sampled data is synthesized with the weighted matrix obtained from the low frequency fully-sampled data, so as to obtain an image of high resolution without overlapping. Here, the low frequency fully-sampled data for obtaining the coil's sensitivity distribution and the weighted matrix are referred to as reference data, the low frequency fully-sampled phase encoding lines in the K-space are referred to as reference lines.

The advantage of increasing imaging speed by parallel acquisition conducted with multi-channel coils is obvious. Given the same sampling time, the parallel acquisition technology can also be used to increase the resolution of an image. The parallel acquisition also has some additional benefits, for example it is able to reduce the image artifacts resulted from off-resonance. Meanwhile, because of the speed increase, the parallel acquisition technology can also reduce artifacts by movements.

However, there is a cost to pay for realizing the parallel acquisition. First, since the data actually acquired are reduced, although an overlapping-free image can be reconstructed by using parallel acquisition reconstruction technology, the signal to noise ratio is the $1/\sqrt{N_f}$ of that of the image by full-sampling under the same hardware conditions, wherein $N_f$ is an accelerating factor, therefore, the larger is the accelerating factor, the bigger is the loss of the image quality, that is, the bigger is the drop of the signal to noise ratio (SNR).

SUMMARY OF THE INVENTION

An object of the present invention is to propose a method for reconstructing parallel-acquired images, so as to improve the SNR of the image reconstructed after the parallel acquisition.

Another object of the present invention is to propose an apparatus for reconstructing parallel-acquired images, so as to improve the SNR of the image reconstructed after the parallel acquisition.

To achieve the above mentioned objects, the technical solutions of the present invention comprise:

A method for reconstructing a parallel-acquired image, comprising: generating reconstruction data by combining uniformly under-sampled data and low-frequency fully-sampled data in MRI K-space according to a hybrid sampling mode; calculating the sensitivity distribution of a coil according to said low-frequency fully-sampled data; and reconstructing an image according to said reconstruction data, said sensitivity distribution of the coil and said hybrid sampling mode.

Wherein, said generating reconstruction data by combining uniformly under-sampled data and low-frequency fully-sampled data in MRI K-space according to a hybrid sampling mode comprises: generating a reconstruction data matrix, and in said reconstruction data matrix, the actually sampled uniformly under-sampled data and low-frequency fully-sampled data in K-space are filled with practically sampled values, the data not sampled are filled with 0.

Wherein, the number of rows in said reconstruction data matrix is the product of the number of sampling channels, the number of phase encoding and the number of sampling points in a read-direction, the number of columns is 1.

Wherein, said calculating the sensitivity distribution of the coil according to the low-frequency fully-sampled data comprises: calculating the coil's sensitivity distribution matrix according to the low-frequency fully-sampled data, and determining the permutation and the dimension of said sensitivity distribution matrix according to the permutation and the dimension of said reconstruction data matrix.

Wherein, said reconstructing the image according to said reconstruction data, said sensitivity distribution of the coil and said hybrid sampling mode comprises: determining a mathematical representation of said hybrid sampling mode; and reconstructing the image according to said reconstruction data, said coil's sensitivity distribution matrix and the mathematical representation of said hybrid sampling mode.

Wherein, said generating the mathematical representation of the hybrid sampling mode comprises: generating a hybrid sampling matrix, filling at the diagonals of said hybrid sampling matrix with 0 and 1 alternately according to an under-sampling rate, and filling at the central fully-sampled corresponding location with 1, and filling at all other locations except the diagonals with 0.

Wherein, said reconstructing the image according to said reconstruction data, said coil's sensitivity distribution matrix and the mathematical representation of said hybrid sampling mode comprises: determining the permutation and dimension of an inverse Fourier transform matrix according to the permutation and dimension of said reconstruction data matrix; calculating a parallel-imaging sampling matrix of the hybrid sampling mode by using said inverse Fourier transform matrix, said hybrid sampling matrix and the coil's sensitivity distribution matrix: $A = M_{Undersampling} \cdot M_{Fourier} \cdot M_{Sensitivity}$, wherein, $M_{Fourier}$ represents the inverse Fourier transform matrix, $M_{Sensitivity}$ represents the coil's sensitivity distribution matrix, $M_{Undersampling}$ represents the hybrid sampling matrix, A represents the parallel-imaging sampling matrix of the hybrid sampling mode: taking the inverse of the parallel-imaging sampling matrix of said hybrid sampling mode as a reconstruction matrix; reconstructing the image by using said reconstruction matrix and said reconstruction data matrix: $ima = (A' \cdot A)^{-1} \cdot A' \cdot V_{rawdata}$, wherein, ima represents a reconstructed image matrix, $V_{rawdata}$ represents the reconstruction data matrix.

Wherein, said reconstructing the image by using the parallel-imaging sampling matrix of said hybrid sampling mode and the reconstruction data matrix comprises: dividing said reconstruction data matrix into N vectors, with each vector comprising M elements, wherein M is the product of the number of sampling channels and the number of phase encoding, N is the number of sampling points in the read-direction; performing reconstruction to said N vectors respectively to obtain N image vectors; and combining said N image vectors to obtain the reconstructed image matrix.

An apparatus for reconstructing a parallel-acquired image, comprising: a reconstruction-data generating unit, for generating reconstruction data by combining uniformly under-sampled data and low-frequency fully-sampled data in MRI K-space according to a hybrid sampling mode; a sensitivity distribution calculating unit, for calculating the sensitivity distribution of a coil according to said low-frequency fully-sampled data; and an image reconstructing unit, for reconstructing an image according to said reconstruction data, said sensitivity distribution of the coil and said hybrid sampling mode.

Wherein, said reconstruction data generating unit generates a reconstruction data matrix, and in said reconstruction data matrix, the actually sampled uniformly under-sampled data and low-frequency fully-sampled data in K-space are filled with practically sampled values, the data not sampled are filled with 0.

Wherein, said sensitivity distribution calculating unit calculates and generates the coil's sensitivity distribution matrix according to the low-frequency fully-sampled data, and determines the permutation and the dimension of said sensitivity distribution matrix according to the permutation and the dimension of said reconstruction data matrix.

Wherein, said image reconstructing unit comprises: a hybrid sampling matrix generating module, for generating a hybrid sampling matrix; an inverse Fourier transform matrix generating module, for determining the permutation and dimension of an inverse Fourier transform matrix according to the permutation and dimension of said reconstruction data matrix, and generating said inverse Fourier transform matrix; a reconstruction matrix generating module, for generating a parallel-imaging sampling matrix of the hybrid sampling mode by using said inverse Fourier transform matrix, said sensitivity distribution matrix and said hybrid sampling matrix, and taking the inverse of the parallel-imaging sampling matrix of said hybrid sampling mode as a reconstruction matrix; and an image reconstruction calculating unit, for reconstructing the image by using said reconstruction matrix and said reconstruction data matrix.

Wherein, said hybrid sampling matrix generating module, during the time of generating the hybrid sampling matrix, fills at the diagonals of said hybrid sampling matrix with 0 and 1 alternately according to an under-sampling rate, and fills at the central fully-sampled corresponding location with 1, and fills at all other locations except the diagonals with 0.

It can be seen from above technical solutions that, in the present invention, the uniform under-sampled data and the low frequency fully-sampled data of the k-space are combined together as the parallel acquisition data for the reconstruction, wherein since the data of the central part of K-space contains more useful information, the data of performing low frequency full-sampling to the K-space contains more useful information. Therefore, when the image reconstruction is performed by using of the parallel acquisition data in which the low frequency fully-sampled data are integrated, it is able to provide more useful information, so as to improve effectively the SNR of the reconstructed image.

BRIEF DESCRIPTION OF THE DRAWINGS

To make abovementioned and further features and advantages of the present invention clear to those skilled in the art, preferred embodiments of the present invention will be described hereinbelow in detail with reference to the drawings in which the identical reference numbers represent the same parts, and in which:

FIG. 4(a) shows the phase encoding lines by uniform under-sampling;

FIG. 4(b) shows the phase encoding lines by low frequency full-sampling;

Figures 5, 6:
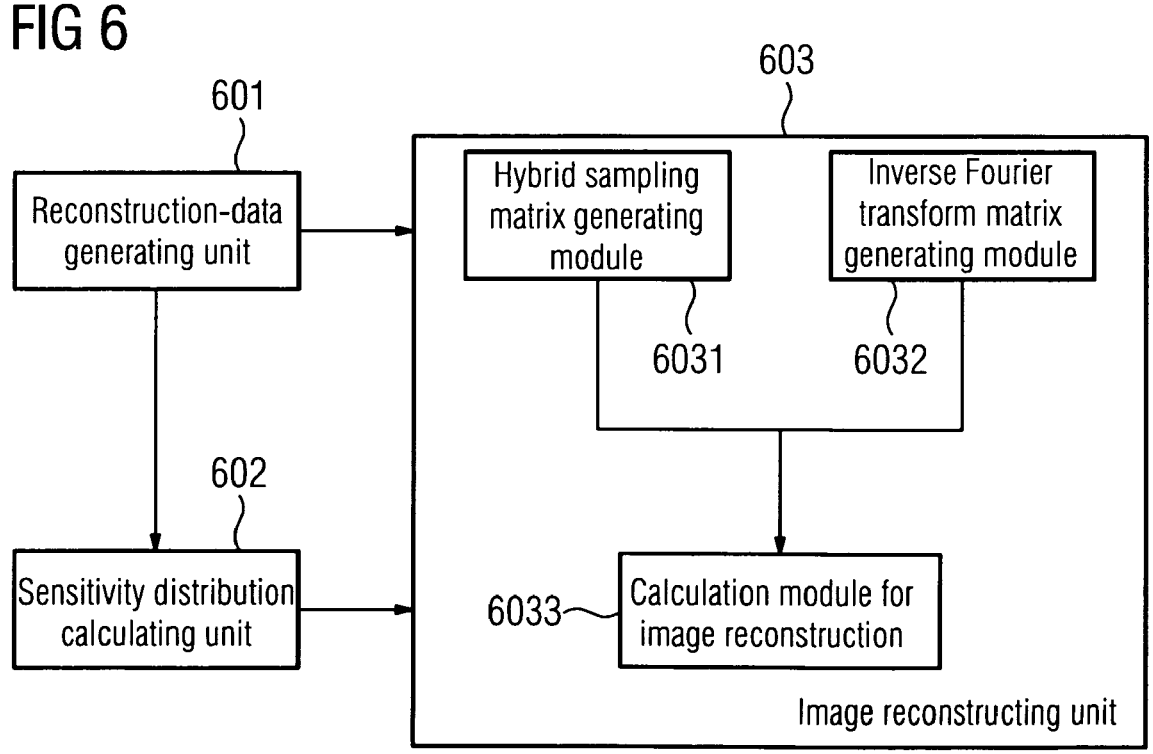
Figure 7:
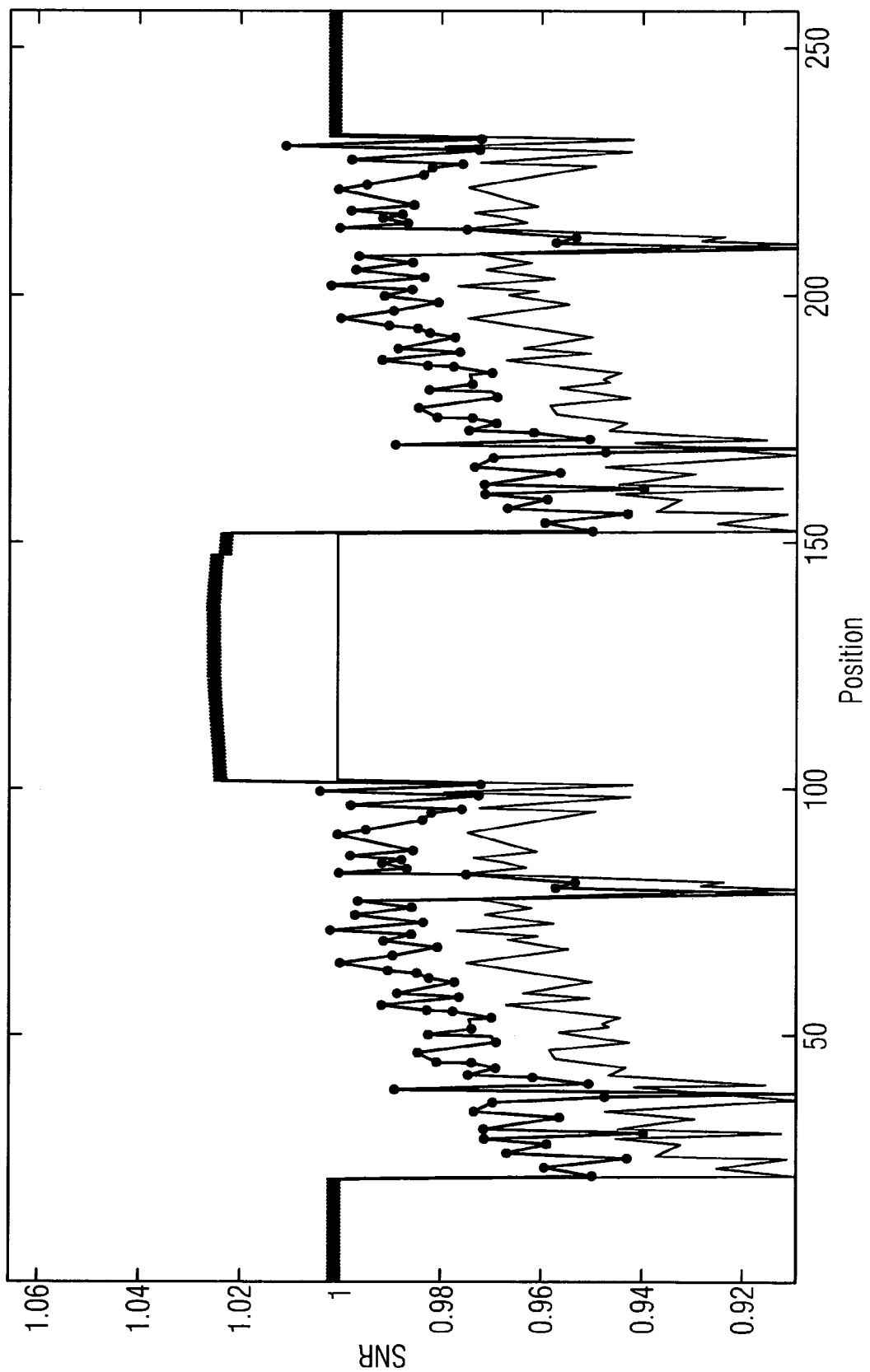

FIG. (4c) shows the combination of the phase encoding lines of uniform sampling and that of low frequency full-sampling;

FIG. 5 is a schematic illustration of a hybrid sampling matrix according to an embodiment of the present invention;

FIG. 6 is a flowchart of the apparatus for reconstructing a parallel-acquired image according to an embodiment of the present invention; and FIG. 7 is an illustration to compare the SNRs, in the case that considers reference lines and the case that doesn't consider reference lines, of the reconstructed images.

DETAILED DESCRIPTION OF THE INVENTION

To make the purpose, the technical solution and the advantages of the present invention more apparent, the present invention will be further described below in detail with reference to the accompanying drawings and embodiments. It is to be understood that, the embodiments described here are only for illustrating the present invention, rather than limiting the scope of the present invention.

According to the present invention, the reconstruction data are combined from the low frequency fully-sampled data and uniform under-sampled data of K-space according to a hybrid sampling mode and the hybrid sampling mode is taken into account during the image reconstruction.

The method of the present invention is illustrated in detail below by an embodiment.

Figure 1:
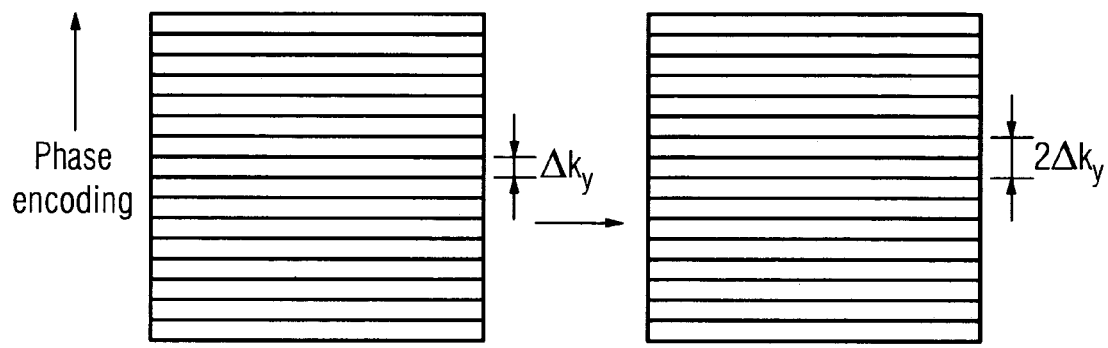
FIG. 1 is a schematic illustration of the full-sampling and under-sampling in the phase encoding direction of a K-space during MRI scanning.
Figure 2:
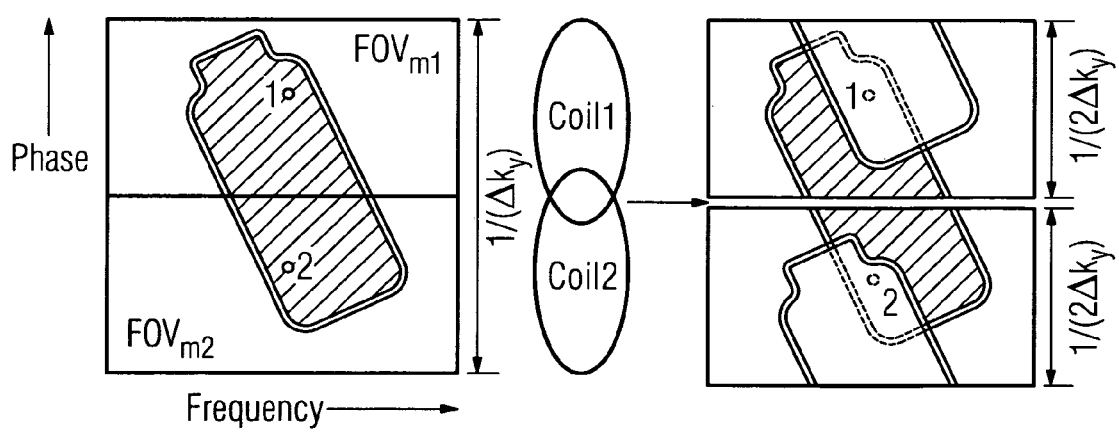
FIG. 2 shows images obtained by the full-sampling and the under-sampling as shown in FIG. 1 in the phase encoding direction.
Figure 3:
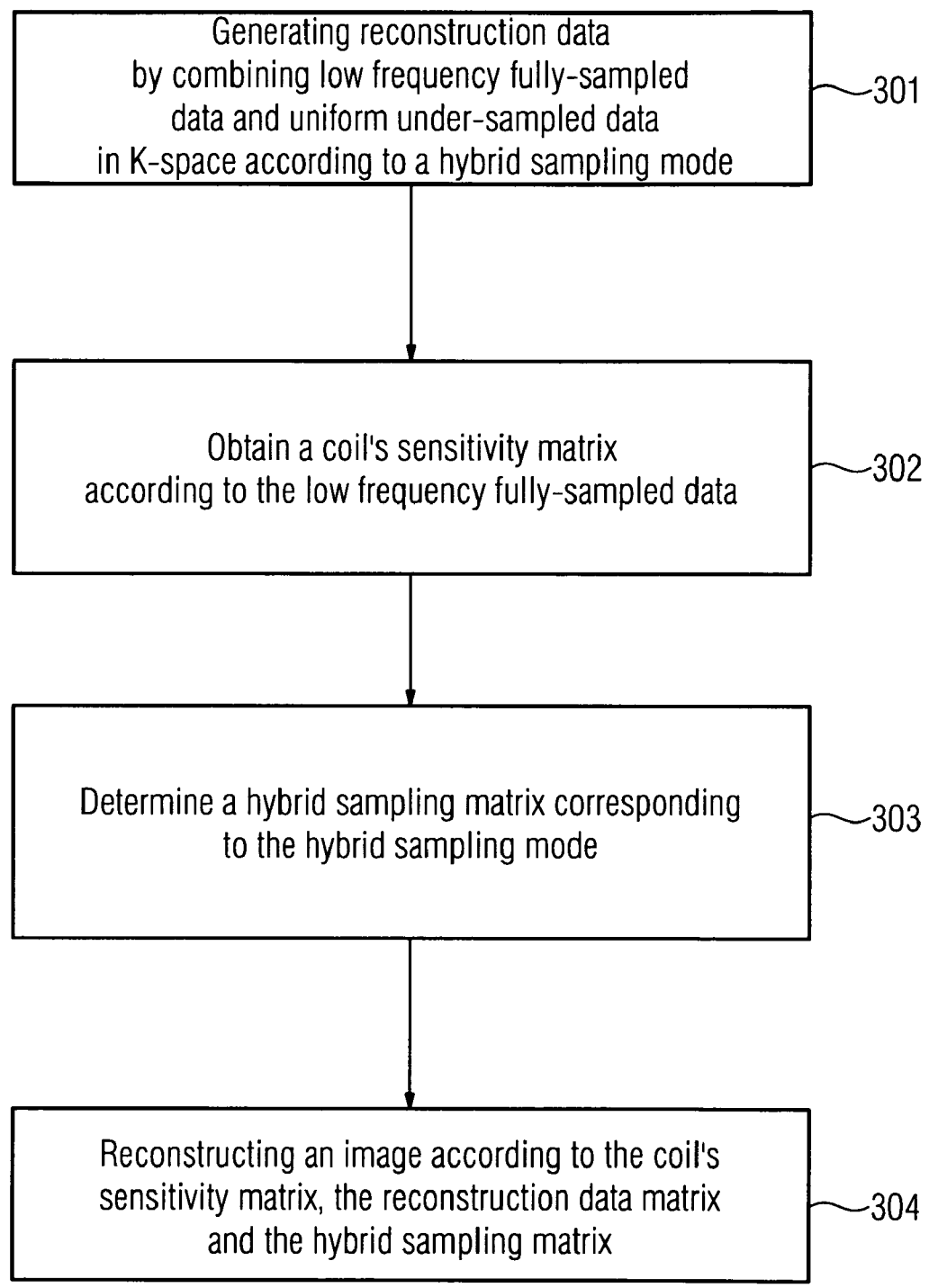
FIG. 3 is a flowchart of the method for reconstructing a parallel-acquired image according to an embodiment of the present invention.

FIG. 3 is the flowchart of the method for reconstructing a parallel-acquired image according to an embodiment of the present invention. As shown in FIG. 3, in this embodiment, the method for reconstructing the parallel-acquired image comprises at least the following steps:

Step 301: generating reconstruction data by combining low-frequency fully-sampled data and uniformly under-sampled data in K-space according to a hybrid sampling mode.

Acquire data in K-space comprises collecting the uniform under-sampling data and reference data. The reference data are the data obtained by fully-sampling the low frequency part of K-space.

FIG. 4(a), FIG. 4(b) and FIG. 4(c) are illustrations of combining the uniform under-sampled data and the low frequency fully-sampled data. Among them, FIG. 4(a) shows the phase encoding lines by uniform under-sampling, FIG. 4(b) shows the phase encoding lines by low frequency full-sampling, and FIG. 4(c) shows the combination of the phase encoding lines by uniform sampling and the phase coding lines by low frequency full-sampling. Assuming the accelerating factor of under-sampling in K-space is 2, that is, the sampling rate is ½, for example, if the full-sampling in the phase encoding direction needs to collect 17 phase encoding lines, denoted respectively as $k_{-8}$ to $k_8$, the uniform under-sampling whose sampling rate is ½ needs to collect 9 phase encoding lines, as shown in FIG. 4(a) by solid lines, these 9 phase encoding lines are denoted respectively as [$k_8$, $k_6$, $k_4$, $k_2$, $k_0$, $k_{-2}$, $k_{-4}$, $k_{-6}$, $k_{-8}$]; the reference data occupy 5 phase encoding lines closest to the centre of K-space, i.e. 5 reference lines, as shown in FIG. 4(b) by solid lines, are denoted respectively as [$k_2$, $k_1$, $k_0$, $k_{-1}$, $k_{-2}$]; and the uniformly sampled data and the reference data are combined to obtain the reconstruction data, as a result, the uniform under-sampled phase encoding line set and the reference line set are combined into a union set, and the data of the union set are used as the reconstruction data, as shown in FIG. 4(c) as by solid lines, the phase encoding lines of the union set are denoted respectively as [$k_8$, $k_6$, $k_4$, $k_2$, $k_1$, $k_0$, $k_1$, $k_2$, $k_{-4}$, $k_{-6}$, $k_{-8}$].

The matrix of the reconstruction data by combining the uniform under-sampled data and the reference data is denoted as $V_{rawdata}$, the calculating formula of its length is:

$$\text{length of } V_{rawdata} = nCH \cdot nPE \cdot nRO \qquad (5)$$

wherein, nCH is the number of acquisition channels, nPE is the number of phase encoding lines, nRO is the number of the sampling points in a read-direction, and in the matrix $V_{rawdata}$, the data of actually acquired phase encoding lines remain unchanged, while the data of the phase encoding lines which are not acquired yet are made as 0. Preferably, the number of rows of the reconstruction data matrix is the product of the number of acquisition channels, the number of phase encoding lines and the number of the points in the read-direction, its number of the columns is 1.

Step 302: calculating the coil's sensitivity distribution matrix $M_{Sensitivity}$ according to the low-frequency fully-sampled data.

The permutation and dimension of $M_{Sensitivity}$ are determined according to the permutation and dimension of $V_{rawdata}$.

Step 303: determining the mathematical representation of a hybrid sampling mode, preferably, determining a hybrid sampling matrix $M_{Undersampling}$.

An example of the hybrid sampling matrix $M_{Undersampling}$ is shown in FIG. 5, it can be seen in FIG. 5 that, in the diagonal of $M_{Undersampling}$, the uniformly sampled locations are filled in with one and zero alternately according to sampling rate, the central fully-sampled location is filled in with one, and other locations except the diagonal are all filled in with zero.

Step 304: reconstructing an image according to the coil's sensitivity distribution matrix $M_{Sensitivity}$, the reconstruction data matrix $V_{rawdata}$, and the hybrid sampling matrix $M_{Undersampling}$.

First it is needed to determine the permutation and dimension of an inverse Fourier transform matrix $M_{Fourier}$ according to the permutation and dimension of the matrix $V_{rawdata}$; then a parallel imaging sampling matrix of the hybrid sampling mode is built according to formula (6):

$$A = M_{Undersampling} \cdot M_{Fourier} \cdot M_{Sensitivity} \qquad (6)$$

wherein, $M_{Fourier}$ represents the inverse Fourier transform matrix, $M_{Sensitivity}$ represents the coil's sensitivity distribution matrix, $M_{Undersampling}$ represents the hybrid sampling matrix, A represents the parallel-imaging sampling matrix of the hybrid sampling mode.

Then the inverse of the parallel imaged sampling matrix A of said hybrid sampling mode is taken as the reconstruction matrix, and the image is reconstructed according to formula (7):

$$ima = (A^* \cdot A)^{-1} \cdot A^* \cdot V_{rawdata} \qquad (7)$$

wherein, ima represents a reconstructed image matrix.

Preferably, in practical applications, the reconstruction data matrix $V_{rawdata}$ can be divided into N vectors, that is to divide said reconstruction data matrix into N vectors, with each vector comprising M elements, wherein M is the product of the number of sampling channels and the number of phase encoding, N is the number of sampling points in the read-direction; performing reconstruction to said N vectors respectively to obtain N image vectors; and combining said N image vectors to obtain the reconstructed image matrix.

FIG. 6 shows the structural diagram of the apparatus for reconstructing a parallel-acquired image according to an embodiment of the present invention. As shown in FIG. 6, in this embodiment, the apparatus for reconstructing a parallel-acquired image comprises at least a reconstruction-data generating unit 601, a sensitivity distribution calculating unit 602 and an image reconstructing unit 603.

The reconstruction data generating unit 601 generates reconstruction data by combining uniformly under-sampled data and low-frequency fully-sampled data in MRI K-space according to a hybrid sampling mode.

The sensitivity distribution calculating unit 602 calculates the sensitivity distribution of a coil according to the low-frequency fully-sampled data.

The image reconstructing unit 603 reconstructs an image according to said reconstruction data, said sensitivity distribution of the coil and said hybrid sampling mode.

Preferably, the reconstruction data generating unit 601 generates a reconstruction data matrix, and in the reconstruction data matrix, the actually sampled uniformly under-sampled data and low-frequency fully-sampled data in K-space are filled with practically sampled values, the data not sampled are filled with 0.

Preferably, the sensitivity distribution calculating unit 602 calculates and generates the coil's sensitivity distribution matrix according to the low-frequency fully-sampled data, and determines the permutation and the dimension of the sensitivity distribution matrix according to the permutation and the dimension of the reconstruction data matrix.

Further, the image reconstructing unit 603 comprises a hybrid sampling matrix generating module 6031, an inverse Fourier transform matrix generating module 6032, a reconstruction matrix generating module 6033 and an image reconstruction calculating unit 6043.

The hybrid sampling matrix generating module 6031 generates a hybrid sampling matrix; the inverse Fourier transform matrix generating module 6032 determines the permutation and dimension of an inverse Fourier transform matrix according to the permutation and dimension of the reconstruction data matrix, and generates the inverse Fourier transform matrix; the reconstruction matrix generating module 6033 generates the parallel-imaging sampling matrix of the hybrid sampling mode by using the inverse Fourier transform matrix, the sensitivity distribution matrix and the hybrid sampling matrix, and takes the inverse of the parallel-imaging sampling matrix of the hybrid sampling mode as the reconstruction matrix; and the image reconstruction calculating unit 6043 reconstructs the image by using the reconstruction matrix and the reconstruction data matrix.

Preferably, the hybrid sampling matrix generating module 6031, during the time of generating the hybrid sampling matrix, fills at the diagonals of said hybrid sampling matrix with 0 and 1 alternately according to an under-sampling rate, and fills at central fully-sampled corresponding locations with 1, and fills at all other locations except the diagonals with 0.

As what described in above, in the present invention, the uniform under-sampled data and the low frequency fully-sampled data in K-space are combined as the parallel acquired data for reconstruction, since the data in central part of K-space contains more useful information, in K-space the low frequency fully-sampled data contains more useful information. Therefore, the parallel-acquired data combined with the low frequency fully-sampled data, after having been Fourier transformed, are capable of providing more useful information, so as to improve the SNR of the reconstructed image. It can be understood that, the improvement of the SNR varies according to the ratio of the quantity of the reference lines to the quantity of the total phase encoding lines, generally, the larger is the ratio of the reference lines to the total phase encoding lines, the higher is the SNR.

FIG. 7 shows the SNR of the reconstructed image in the case that the ratio of the reference lines to the total phase encoding lines is 10% and the SNR of the reconstructed image in the case that no reference lines have been taken into account. In FIG. 7, the upper curve represents the SNR of the reconstructed image in the case that the ratio of the reference lines to the total phase encoding lines is 10%, the lower curve represents the SNR of the reconstructed image in the case that no reference lines have been taken into account. It can be seen from FIG. 7 that, by comparing with the SNR of the reconstructed image in the case that no reference lines have been taken into account, and the case that the ratio of the reference lines to the total phase encoding lines is 10%, the improvement of the SNR is about 2%.

What described above are merely the preferred embodiments of the present invention, which are not to be used to limit the scope of the present invention, and any modifications, replacements of equivalents, improvements and so on within the spirit and the principles of the present invention should be covered in the scope of protection for the present invention.

The invention claimed is:

1. A method for reconstructing an image for a parallel-acquired image acquired by a MRI device, comprising:
   generating reconstruction data by combining uniformly under-sampled data of the parallel-acquired image and low-frequency fully-sampled data of the parallel-acquired image in K-space according to a hybrid sampling mode;
   calculating a sensitivity distribution of a coil of the MRI device according to the low-frequency fully-sampled data; and
   reconstructing the image according to the reconstruction data, the sensitivity distribution of the coil, and the hybrid sampling mode.

2. The method as claimed in claim 1, wherein the reconstruction data comprises a reconstruction data matrix.

3. The method as claimed in claim 2, wherein the reconstruction data matrix comprises sampled data that are filled with sampled values and not sampled data that are filled with 0.

4. The method as claimed in claim 2, wherein a number of rows in the reconstruction data matrix is a product of a number of sampling channels, a number of phase encoding, and a number of sampling points in a read-direction.

5. The method as claimed in claim 2, wherein a number of columns in the reconstruction data matrix is 1.

6. The method as claimed in claim 2, wherein the sensitivity distribution of the coil comprises a sensitivity distribution matrix of the coil.

7. The method as claimed in claim 6, wherein a permutation and dimension of the sensitivity distribution matrix is determined based on a permutation and dimension of the reconstruction data matrix.

8. The method as claimed in claim 7, wherein the hybrid sampling mode comprises a hybrid sampling matrix.

9. The method as claimed in claim 8, wherein a diagonal of the hybrid sampling matrix is alternately filled with 1 and 0 at uniformly under-sampled locations according to an under-sampling rate and filled with 1 at a central fully-sampled location.

10. The method as claimed in claim 8, wherein other locations of the hybrid sampling matrix except the diagonal are filled with 0.

11. The method as claimed in claim 7, wherein the image is reconstructed by steps comprising:
    determining a permutation and dimension of an inverse Fourier transform matrix according to a permutation and dimension of the reconstruction data matrix;
    calculating a parallel-imaging sampling matrix by a formula:

$$A = M_{Undersampling} \cdot M_{Fourier} \cdot M_{Sensitivity},$$

wherein:
    $M_{Fourier}$ represents the inverse Fourier transform matrix,
    $M_{Sensitivity}$ represents the sensitivity distribution matrix of the coil,
    $M_{undersampling}$ represents the hybrid sampling matrix, A represents the parallel-imaging sampling matrix; and reconstructing the image by a formula:

$$ima = (A' \cdot A)^{-1} \cdot A' \cdot V_{rawdata},$$

wherein:
ima represents a reconstructed image matrix of the image, and $V_{rawdata}$ represents the reconstruction data matrix.

12. The method as claimed in claim 11, further comprising: dividing the reconstruction data matrix into N vectors with each vector comprising M elements, wherein:
M is a product of a number of sampling channels and a number of phase encoding, and
N is a number of sampling points in a read-direction; generating N image vectors by reconstructing the N vectors; and determining the reconstructed image matrix by combining the N image vectors.

13. An apparatus for reconstructing an image for a parallel-acquired image acquired by a MRI device, comprising:
a reconstruction-data generating unit that generates reconstruction data by combining uniformly under-sampled data of the parallel-acquired image and low-frequency fully-sampled data of the parallel-acquired image in K-space according to a hybrid sampling mode;
a sensitivity distribution calculating unit that calculates a sensitivity distribution of a coil of the MRI device according to the low-frequency fully-sampled data; and
an image reconstructing unit that reconstructs the image according to the reconstruction data, the sensitivity distribution of the coil, and the hybrid sampling mode.

14. An image device, comprising:
a MRI imaging acquisition device that acquires a parallel-acquired image of an object; and
an image processing unit that:
generates reconstruction data by combining uniformly under-sampled data of the parallel-acquired image and low-frequency fully-sampled data of the parallel-acquired image in K-space according to a hybrid sampling mode,
calculates a sensitivity distribution of a coil of the MRI device according to the low-frequency fully-sampled data, and
reconstructs the image according to the reconstruction data, the sensitivity distribution of the coil, and the hybrid sampling mode.

\* \* \* \* \*